(12) United States Patent
Rowhani et al.

(10) Patent No.: US 8,680,648 B2
(45) Date of Patent: Mar. 25, 2014

(54) COMPACT METAL CONNECT AND/OR DISCONNECT STRUCTURES

(75) Inventors: Omid Rowhani, Newmarket (CA); Victor M. Ma, Fremont, CA (US)

(73) Assignee: ATI Technologies ULC, Markham, ON (CA)

( * ) Notice: Subject to any disclaimer, the term of this patent is extended or adjusted under 35 U.S.C. 154(b) by 175 days.

(21) Appl. No.: 13/156,399

(22) Filed: Jun. 9, 2011

(65) Prior Publication Data

US 2012/0313254 A1 Dec. 13, 2012

(51) Int. Cl.
*H01L 23/52* (2006.01)

(52) U.S. Cl.
USPC .... 257/529; 257/528; 257/530; 257/E23.146; 257/E23.171

(58) Field of Classification Search
USPC .............. 257/528, 529, 530, 774, E29.111, 257/E29.33, E23.011, E23.145, E23.146, 257/E23.147, E23.148, E23.149, E23.15, 257/E23.171
See application file for complete search history.

(56) References Cited

U.S. PATENT DOCUMENTS

| | | | |
|---|---|---|---|
| 5,191,241 A * | 3/1993 | McCollum et al. | 326/41 |
| 6,160,420 A * | 12/2000 | Gamal et al. | 326/41 |
| 6,331,790 B1 * | 12/2001 | Or-Bach et al. | 326/41 |
| 7,304,496 B2 * | 12/2007 | Phoon et al. | 326/38 |
| 7,304,497 B2 * | 12/2007 | Phoon et al. | 326/38 |
| 7,689,960 B2 * | 3/2010 | Park et al. | 716/119 |
| 8,022,503 B2 * | 9/2011 | Shih et al. | 257/530 |
| 2005/0045919 A1 * | 3/2005 | Kaeriyama et al. | 257/211 |
| 2009/0001348 A1 * | 1/2009 | Kaeriyama et al. | 257/4 |

\* cited by examiner

*Primary Examiner* — Eduardo A Rodela

(57) ABSTRACT

Embodiments of present invention provide methods and apparatuses for connecting and/or disconnecting nodes in a semiconductor device. Embodiments of the apparatus may include a plurality of metal layers formed above a substrate and an interconnect structure formed between first and second nodes in the plurality of metal layers. The interconnect structure includes one or more metal lines formed in each of the metal layers. The metal lines are connected by a plurality of vias. Modifying one of the metal lines in any one of the metal layers changes an electrical connection between the first and second nodes.

13 Claims, 8 Drawing Sheets

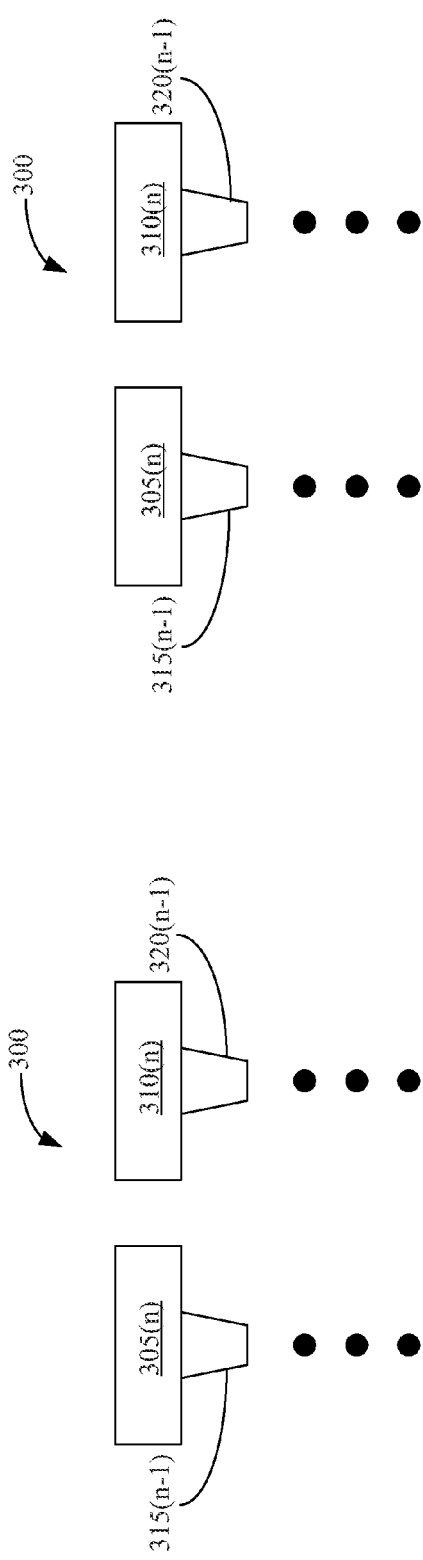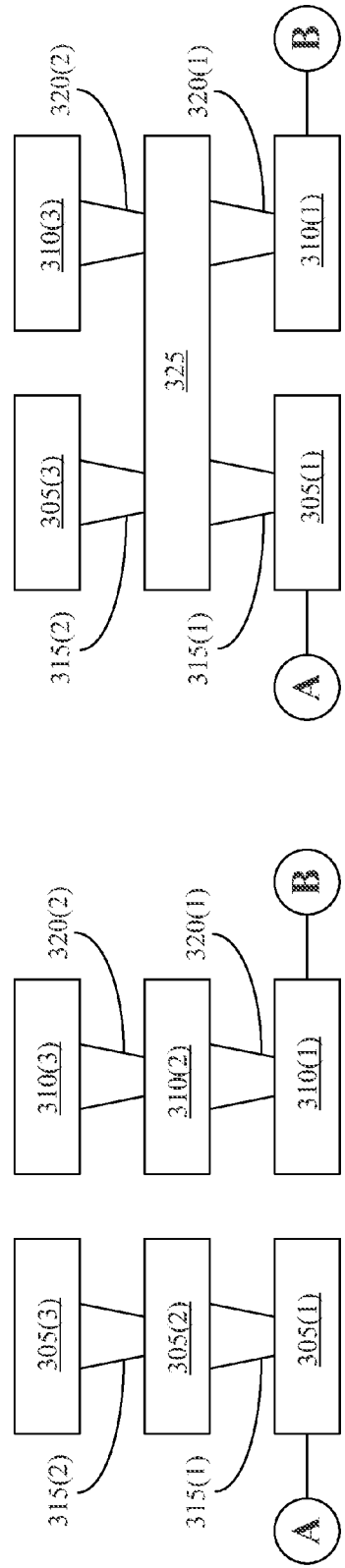
Figure 3A
Figure 3B

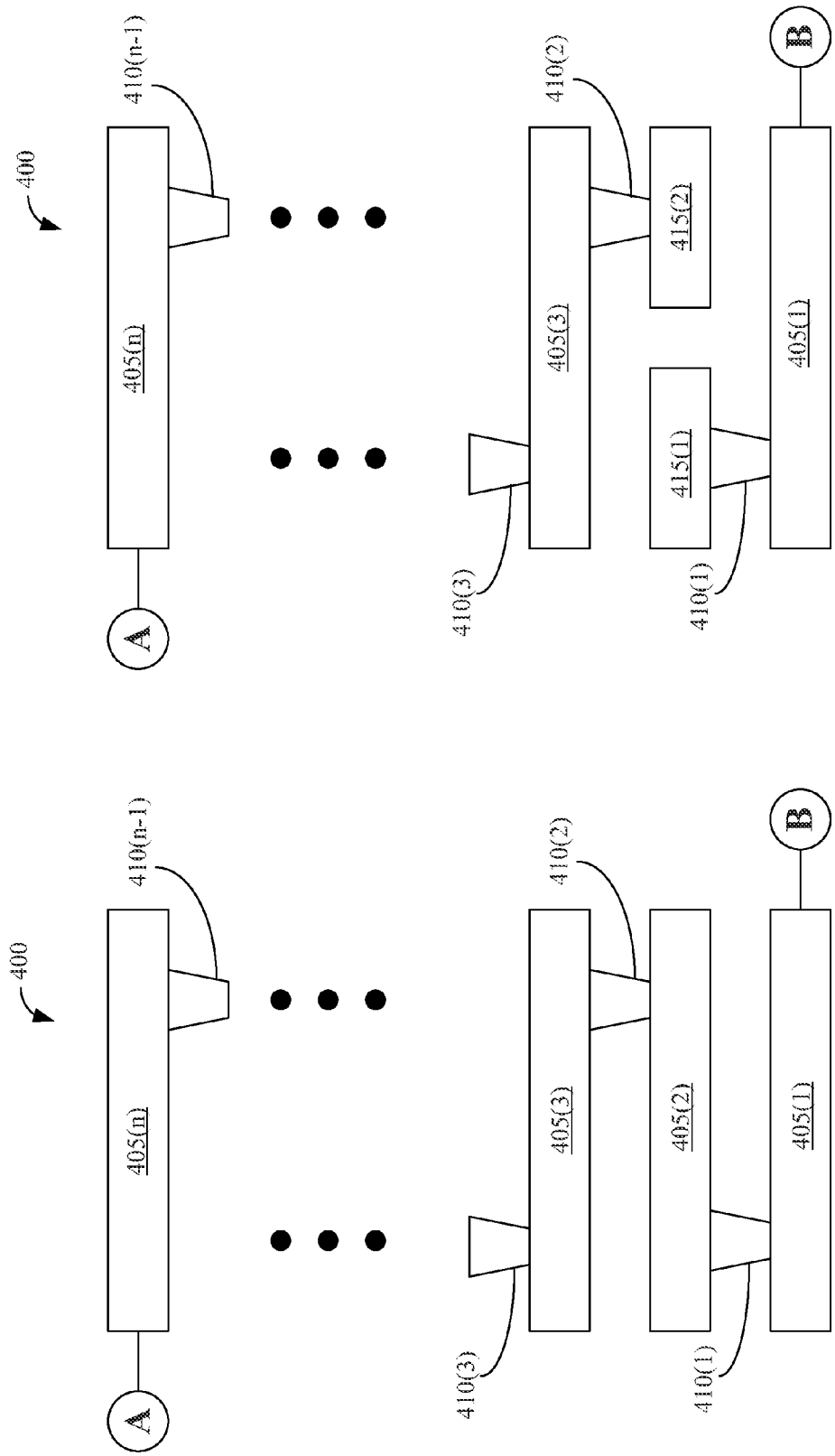

COMPACT METAL CONNECT AND/OR DISCONNECT STRUCTURES

BACKGROUND

1. Field of the Described Subject Matter

This invention relates generally to integrated circuits, and, more particularly, to compact metal connect and/or disconnect structures that are formed in integrated circuits.

2. Description of the Related Art

Modern semiconductor devices typically include millions of transistors that are interconnected to form the functional elements of the semiconductor device. These simple building blocks can be used to form increasingly sophisticated devices such as central processing units (CPUs), graphical processing units (GPUs), accelerated processing units (APUs), and the like. Although very sophisticated automated design techniques are used to create the layouts that are used to fabricate integrated circuits on semiconductor devices, the immense complexity of these designs almost inevitably leads to unexpected operational behaviors in actual fabricated devices. Consequently, the fabrication process is often an iterative process requiring changes to portions of the semiconductor device that are performed by re-spinning one or more layers. For example, clock trees may need to be fine-tuned, data paths may need to be changed, and logic cells may need to be modified to implement different logical functions.

Re-spinning requires changing one or more layers that include the circuits to be modified, re-forming the circuits according to a new or modified layout or design, and then re-forming all of the overlying layers. Re-spinning is therefore a costly process both in terms of money and in terms of scheduling. The costs associated with re-spinning typically increase in proportion to the number of layers that need to be changed and then re-formed according to the modified layout. For example, conventional integrated circuit designs include several metal layers that are used to form the electrically conductive interconnects that convey electric signals between functional elements such as transistors or other logical units in the integrated circuit. Re-spinning lower-level metal layers is typically significantly more expensive than re-spinning higher-level metal layers, at least in part because lower layers tend to be more complex and re-spinning a lower-level metal layer requires re-forming the layers above the lower-level metal layer.

SUMMARY

The disclosed subject matter is directed to addressing the effects of one or more of the problems set forth above. The following presents a simplified summary of the disclosed subject matter in order to provide a basic understanding of some aspects of the disclosed subject matter. This summary is not an exhaustive overview of the disclosed subject matter. It is not intended to identify key or critical elements of the disclosed subject matter or to delineate the scope of the disclosed subject matter. Its sole purpose is to present some concepts in a simplified form as a prelude to the more detailed description that is discussed later.

In one embodiment, an apparatus is provided for connecting and/or disconnecting nodes in a semiconductor device. Embodiments of the apparatus may include a plurality of metal layers formed above a substrate and an interconnect structure formed between first and second nodes in the plurality of metal layers. The interconnect structure includes one or more metal lines formed in each of the metal layers. The metal lines are connected by a plurality of vias. Modifying one of the metal lines in any one of the metal layers changes an electrical connection between the first and second nodes.

In one embodiment, a semiconductor device is provided in which nodes can be connected and/or disconnected. Embodiments of the semiconductor device may include one or more functional entities formed above a substrate. Nodes within the functional entities are electrically connected through a plurality of metal layers. Embodiments of the semiconductor device may also include one or more interconnect structures formed between nodes in the plurality of metal layers. The interconnect structure includes metal lines formed in each of the metal layers and the metal lines are connected by a plurality of vias. Modifying one of the metal lines in any one of the metal layers changes an electrical connection between the first and second nodes. Changing the electrical connection modifies operation of the functional entity.

BRIEF DESCRIPTION OF THE DRAWINGS

The disclosed subject matter may be understood by reference to the following description taken in conjunction with the accompanying drawings, in which like reference numerals identify like elements, and in which:

FIG. 3A conceptually illustrates a first exemplary embodiment of an interconnect structure that may be implemented in semiconductor devices such as the processing system shown in FIG. 1;

FIG. 3B conceptually illustrates the first exemplary embodiment of the interconnect structure after it has been modified;

FIG. 4A conceptually illustrates a second exemplary embodiment of an interconnect structure that may be implemented in semiconductor devices such as the processing system shown in FIG. 1;

FIG. 4B conceptually illustrates the second exemplary embodiment of the interconnect structure after it has been modified;

Figure 1:
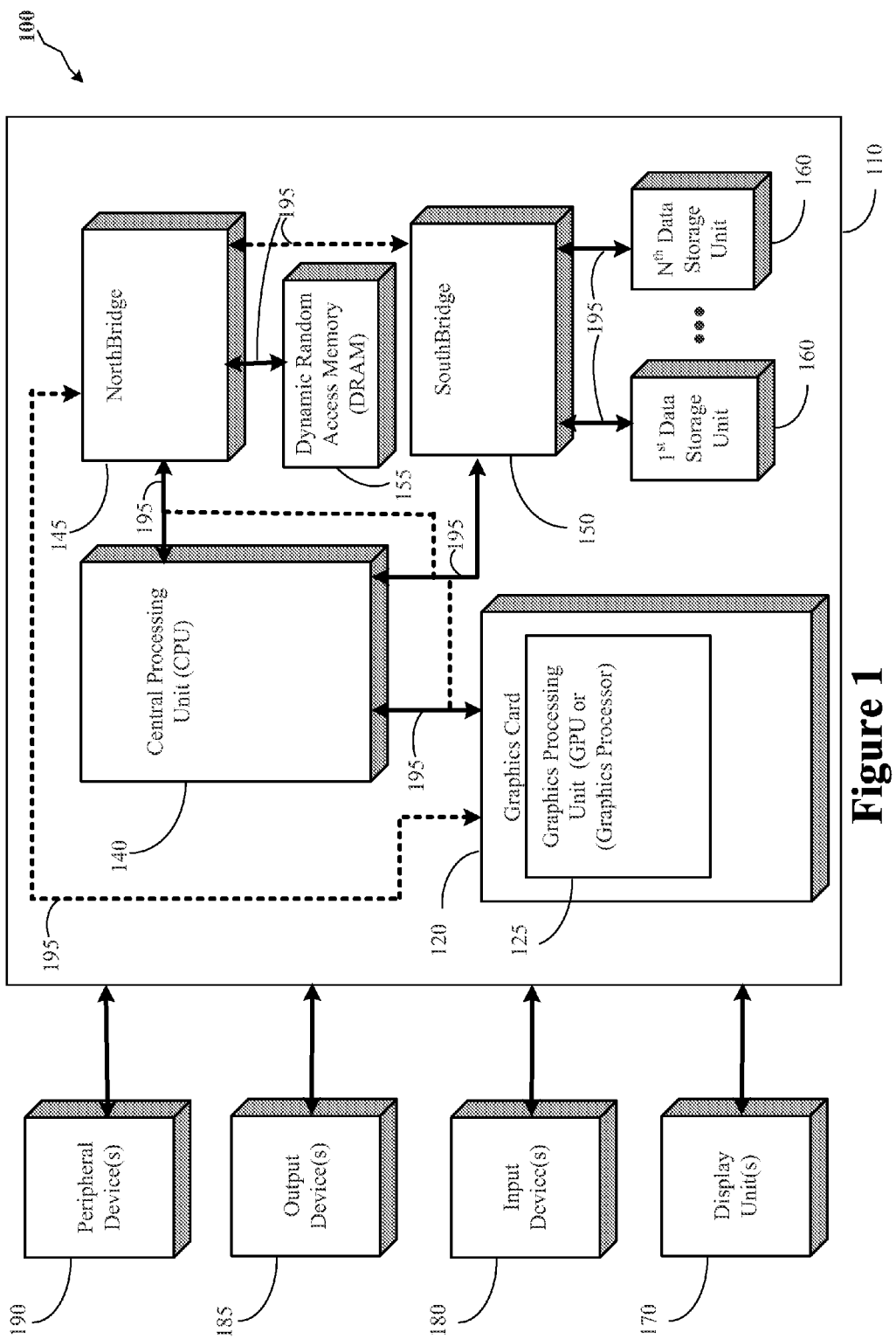
FIG. 1 conceptually illustrates one exemplary embodiment of a semiconductor device such as may be found in a processing system.

While the disclosed subject matter is susceptible to various modifications and alternative forms, specific embodiments thereof have been shown by way of example in the drawings and are herein described in detail. It should be understood, however, that the description herein of specific embodiments is not intended to limit the disclosed subject matter to the particular forms disclosed, but on the contrary, the intention is to cover all modifications, equivalents, and alternatives falling within the scope of the appended claims.

DETAILED DESCRIPTION OF SPECIFIC EMBODIMENTS

Illustrative embodiments are described below. In the interest of clarity, not all features of an actual implementation are described in this specification. It will of course be appreciated that in the development of any such actual embodiment, numerous implementation-specific decisions should be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The disclosed subject matter will now be described with reference to the attached figures. Various structures, systems and devices are schematically depicted in the drawings for purposes of explanation only and so as to not obscure embodiments of the present invention with details that are well known to those skilled in the art. Nevertheless, the attached drawings are included to describe and explain illustrative examples of the disclosed subject matter. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present application describes an interconnect structure including conductive lines and vias formed between nodes in the metal layers used to form a functional portion of a semiconductor device. The interconnect structure can subsequently be modified to change the electrical connection between the nodes, e.g., by forming a complete conductive path between the nodes where none existed before or by severing an existing conductive path between the nodes to break the electrical connection between the nodes. The interconnect structure traverses multiple metal layers in the semiconductor device so the modifications to the electrical connection between the nodes can be made by making or breaking the conductive path at any one of the layers. The interconnect structure therefore provides flexibility when re-spinning portions of the semiconductor device. For example, operation of the functional portion of the semiconductor device can be modified by modifying the interconnect structure at a relatively high level metal layer, even though one or more of the nodes may be at a relatively low metal layer. Consequently, the number of layers that need to be removed and subsequently re-spun (perhaps using a modified mask) can be reduced, thereby reducing monetary and/or scheduling costs associated with the re-spin of the semiconductor device.

FIG. 1 conceptually illustrates one exemplary embodiment of a semiconductor device such as may be found in a processing system 100. In the illustrated embodiment, the processing system 100 may include a processor such as a central processing unit 140 a memory 155, and various other circuitry contained on one or more semiconductor substrates. Those skilled in the art will recognize that the processing system 100 may be constructed from these and other components. However, in the interest of clarity, only those components useful to an understanding of embodiments of the present invention are included. In various embodiments, the processing system 100 may be a personal computer, a laptop computer, a handheld computer, a netbook computer, a tablet computer, a mobile device, a telephone, a personal data assistant (PDA), a server, a mainframe, a work terminal, or the like.

In the illustrated embodiment, the processing system 100 includes a main structure 110 that may be a computer motherboard, system-on-a-chip, circuit board or printed circuit board, a desktop computer enclosure and/or tower, a laptop computer base, a server enclosure, part of a mobile device, personal data assistant (PDA), or the like. In one embodiment, the main structure 110 includes a graphics card 120. The graphics card 120 may be a Radeon™ graphics card from Advanced Micro Devices ("AMD") or any other graphics card using memory, in alternate embodiments. The graphics card 120 may, in different embodiments, be connected on a Peripheral Component Interconnect (PCI) Bus (not shown), PCI-Express Bus (not shown) an Accelerated Graphics Port (AGP) Bus (also not shown), or any other connection known in the art. It should be noted that embodiments of the present invention are not limited by the connectivity of the graphics card 120 to the main structure 110. In one embodiment, the processing system 100 runs an operating system such as Linux, Unix, Windows, Mac OS, or the like. In one embodiment, the graphics card 120 may contain a processor such as the graphics processing unit (GPU) 125 used in processing graphics data. In various embodiments the graphics card 120 may be referred to as a circuit board or a printed circuit board or a daughter card or the like.

The illustrated embodiment of the processing system 100 also includes a processor, such as a central processing unit (CPU) 140, which is connected to a northbridge 145. The CPU 140 and the northbridge 145 may be housed on the motherboard (not shown) or some other structure of the computer system 100. It is contemplated that in certain embodiments, the graphics card 120 may be coupled to the CPU 140 via the northbridge 145 or some other connection as is known in the art. For example, the CPU 140, the northbridge 145, and the GPU 125 may be included in a single processor, a single package or as part of a single die or "chip." Alternative embodiments, which may alter the arrangement of various components illustrated as forming part of main structure 110, are also contemplated. In certain embodiments, the northbridge 145 may be coupled to a system RAM (or DRAM) 155; in other embodiments, the system RAM 155 may be coupled directly to the CPU 140. The system RAM 155 may be of any RAM type known in the art; the type of RAM 155 does not limit the embodiments of the present invention. In one embodiment, the northbridge 145 may be connected to a southbridge 150. In other embodiments, the northbridge 145 and the southbridge 150 may be on the same chip in the processing system 100, or the northbridge 145 and the southbridge 150 may be on different chips. In various embodiments, the southbridge 150 may be connected to one or more data storage units 160. The data storage units 160 may be hard drives, solid state drives, magnetic tape, or any other writable media used for storing data. In various embodiments, the CPU 140, the northbridge 145, the southbridge 150, the graphics processing unit 125, and/or the DRAM 155 may be a computer chip or a silicon-based computer chip, or may be part of a computer chip or a silicon-based computer chip. In one or more embodiments, the various components of the processing system 100 may be operatively, electrically and/or physically connected or linked with a bus 195 or more than one bus 195.

The processing system 100 may be connected to one or more display units 170, input devices 180, output devices 185, and/or peripheral devices 190. It is contemplated that in various embodiments, these elements may be internal or external to the processing system 100, and may be wired or wirelessly connected, without affecting the scope of the embodiments of the present invention. The display units 170 may be internal or external monitors, television screens, handheld device displays, and the like. The input devices 180 may be any one of a keyboard, mouse, track-ball, stylus, mouse pad, mouse button, joystick, scanner or the like. The output devices 185 may be any one of a monitor, printer, plotter, copier or other output device. The peripheral devices 190 may be any other device which can be coupled to a computer: a CD/DVD drive capable of reading and/or writing to physical digital media, a USB device, Zip Drive, external floppy drive, external hard drive, phone and/or broadband modem, router/gateway, access point and/or the like. To the extent certain exemplary aspects of the processing system 100 are not described herein, such exemplary aspects may or may not be included in various embodiments without limiting the spirit and scope of the embodiments of the present invention as would be understood by one of skill in the art.

Actual implementations of the processing system 100, such as devices that may be sold to customers, are typically formed by an iterative process that allows operation of the elements of the processing system 100 to be fine-tuned and errors in the design or the fabricated device to be corrected. For example, a first iteration of the processing system 100 can be fabricated according to a first design that is reflected in a first recipe, which may be defined by a first set of masks and corresponding processing steps determined by the first design. Wafer electrical tests, logic tests, and/or metrology may be used to assess the performance of the fabricated processing system 100. Re-spins may then be used to fine-tune the design and/or correct any errors found in the first iteration. For example, one or more layers in the implementation of the processing system 100 may be removed and re-spun according to new recipes that may be defined by a modified set of masks and corresponding process steps. This procedure may continue until predetermined performance criteria are met. As described herein, the iterative process may be simplified and/or streamlined by forming multi-level interconnect structures in the processing system 100 that can be used to modify the operation of functional elements in the processing system 100 by changing the nature of the electrical connection between nodes in the functional elements. The electrical connection can be changed by modifying the interconnect structure at any one of the levels traversed by the interconnect structure.

Figure 2:
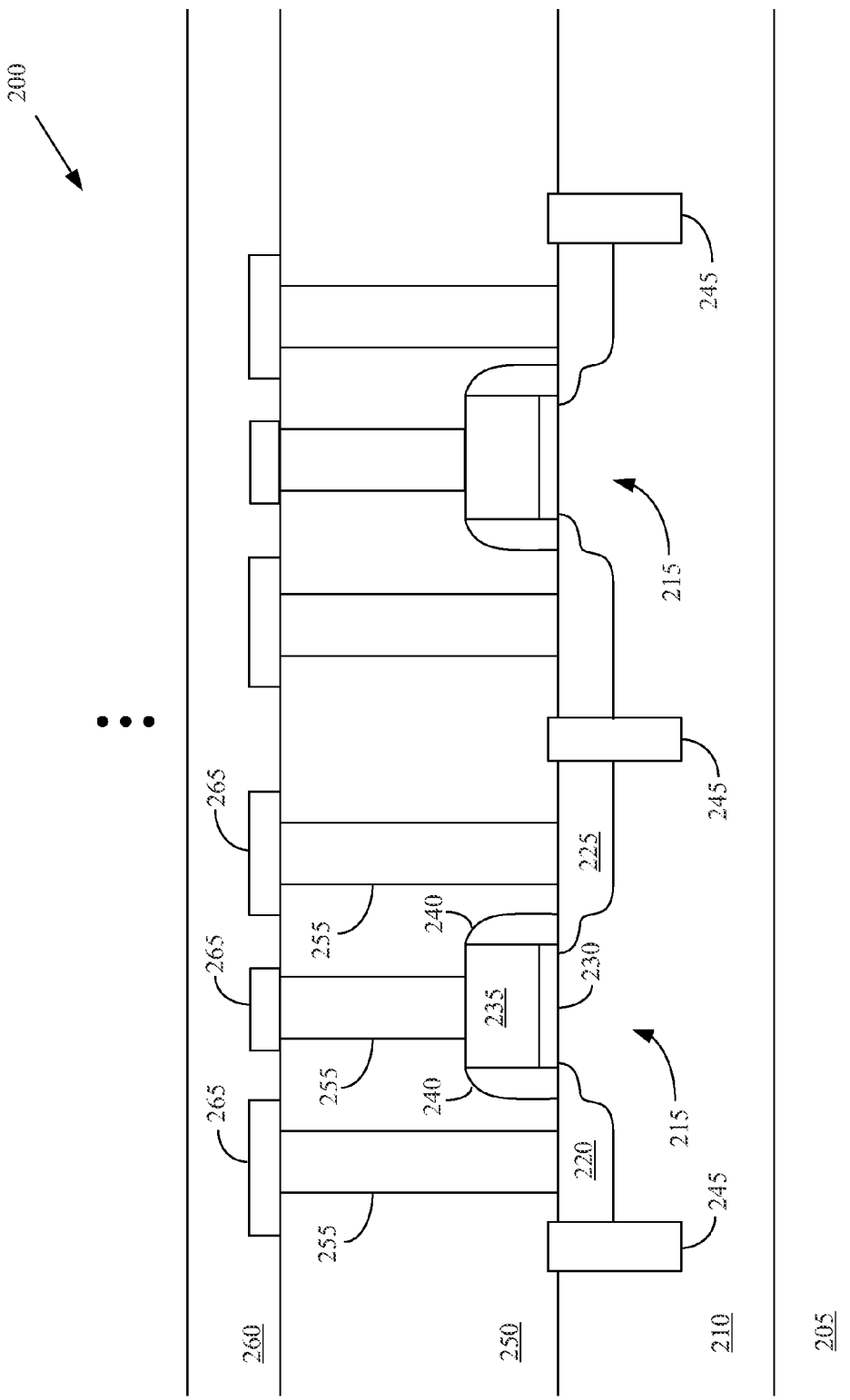
FIG. 2 conceptually illustrates one exemplary embodiment of a cross-section of a portion of a semiconductor device.

FIG. 2 conceptually illustrates one exemplary embodiment of a cross-section of a portion 200 of a semiconductor device. The portion 200 shown in cross-section in FIG. 2 may represent a portion of the circuitry used to construct elements of the processing system 100 shown in FIG. 1. In the illustrated embodiment, the portion 200 is formed on a substrate 205. For example, the substrate 205 may be a silicon substrate for a portion of a silicon-on-insulator (SOI) substrate. A dielectric layer 210 may then be formed on the substrate 205 using well known deposition and/or epitaxial growth techniques. One or more transistors 215 may then be formed in or on the dielectric layer 210 using well known techniques such as deposition, masking, etching, implantation, annealing, polishing or planarizing, and the like. In the interest of clarity, these well-known techniques will not be described in detail herein.

The illustrated embodiments of the transistors 215 include source and drain regions 220, 225, gate insulator layers 230, gate electrodes 235, and spacer elements 240. Other embodiments of the transistors 215 may include more or fewer elements. In the illustrated embodiment, the transistors 215 are electrically isolated from each other by trenches 245, which may be filled with insulating material according to well-known techniques. Since the transistors 215 are formed in the dielectric layer 210, this layer may also be referred to as a device layer 210. An insulating layer 250 may then be formed over the device layer 210 and vias 255 can be etched through the insulating layer 250 and subsequently filled with a conductive material to provide an electrical path to various portions of the transistors 215, such as the source region 220, the drain regions 225, and the gate electrode 235.

A metal layer 260 may then be formed over the insulating layer 250. Although the layer 260 is referred to as a "metal" layer 260, persons of ordinary skill in the art having benefit of the present disclosure should appreciate that the metal layer 260 is formed using an insulating material and then creating metal lines 265 within the insulating material. In the illustrated embodiment, the metal layer 260 includes metal lines 265 that are in electrical contact with one or more of the vias 260. The metal lines 265 are patterned to electrically connect various nodes in the device layer 210 to implement the functionality of a portion of a semiconductor device. The patterns of the metal lines 265 may be reflected in masks that are used to form the metal lines 265 using well known photolithography, etch, and deposition processes that are used to pattern the metal layer 260 and provide conductive fills to create the metal lines 265.

The portion 200 of the semiconductor device may include numerous layers, such as a stack of device layers 210, insulating layers 250, and metal layers 260. Elements within the layer stack may be interconnected to implement the functionality of the portion 200 of the semiconductor device. In one embodiment, the complexity of the metal layers 260 may decline at higher levels, e.g., at levels that are formed further from the underlying substrate 205 such that there are more levels or layers intervening between the higher-level layers and the substrate 205. For example, metal lines 265 in the higher metal layers 260 may be used to interconnect relatively larger functional blocks of transistors 215 and so the complexity and/or density of metal lines 265 in the higher metal layers 260 may be lower than the complexity and/or density of metal lines 265 in the lower metal layers 260 that are used to interconnect smaller blocks of transistors 215 or individual transistors 215.

FIG. 3A conceptually illustrates a first exemplary embodiment of an interconnect structure 300 that may be implemented in semiconductor devices such as the processing system 100 shown in FIG. 1. In the interest of clarity, the insulating material and/or dielectric material that form portions of the different layers in the interconnect structure 300 are not shown in FIG. 3A and only the metal lines 305, 310 and vias 315, 320 that are formed within this material are depicted. Embodiment of the interconnect structure 300 shown in FIG. 3A includes n metal layers that are interconnected by n−1 sets of vias 315, 320. Each metal layer includes two metal lines 305, 310 that are isolated from each other by sufficient insulating material to substantially prevent or break an electrical connection between the two metal lines 305, 310 in the corresponding metal layer. The metal lines 305, 310 are also separated into different stacks that are interconnected by a corresponding set of vias 315, 320. For example, the metal lines 305(1 . . . n) are connected by a corresponding set of vias 315(1 . . . n−1) to form a conductive path from the highest level metal line 305(*n*) to the lowest level metal line 305(1), which is in turn electrically connected to a node A. The metal lines 310(1 . . . n) are connected by a corresponding set of vias 320(1 . . . n−1) to form a conductive path from the highest level metal line 310(*n*) to the lowest level metal line 310(1), which is in turn electrically connected to a node B. Consequently, the interconnect structure 300 shown in FIG. 3A does not provide an electrical connection between the nodes A-B. Persons of ordinary skill in the art having benefit of the present disclosure should appreciate that although nodes A-B are electrically connected to the metal lines 305(1) and 310(1), respectively, alternative embodiments of the interconnect structure 300 may electrically connect the nodes A-B to metal lines 305, 310 in any of the metal layers.

FIG. 3B conceptually illustrates the first exemplary embodiment after the interconnect structure 300 has been modified. In the illustrated embodiment, the interconnect structure 300 has been modified by re-spinning the second metal layer to change the configuration of the metal lines 305(2), 310(2) and form a single metal line 325 that provides a conductive path to electrically connect the vias 315(1) and 320(1). Modification of the interconnect structure 300 to form the single metal line 325 also result in the interconnect structure 300 providing an uninterrupted conductive path between the nodes A and B. The modifications to the interconnect structure 300 therefore modify the electrical connection between the nodes A and B from a broken or interrupted electrical connection to an uninterrupted electrical connection. As will be discussed herein, modifying the electrical connection can also be used to modify operation of functional elements that include embodiments of the interconnect structure 300. Although FIG. 3B depicts one embodiment in which the metal lines 305(2), 310(2) are modified to form the metal line 325 in the second metal layer, in alternative embodiments the electrical connection between the nodes A and B can be made by modifying any one (or more) of the metal lines 305, 310 in any one (or more) of the metal layers.

FIG. 4A conceptually illustrates a second exemplary embodiment of an interconnect structure 400 that may be implemented in semiconductor devices such as the processing system 100 shown in FIG. 1. In the interest of clarity, the insulating material and/or dielectric material that forms portions of the different layers in the interconnect structure 400 are not shown in FIG. 4A and only the metal lines 405 and vias 410 that are formed within this material are depicted. Embodiments of the interconnect structure 400 shown in FIG. 4A include n metal layers that are interconnected by n−1 sets of vias 410. The vias 410 in the illustrated embodiment are distributed into two groups that are in columns separated by a selected distance. Each metal layer includes a metal line 405 that traverses at least the selected distance that separates the columns of the vias 410. One end of each metal line 405 is electrically connected to a via 410 in one of the columns and the other end of each metal line 405 electrically connected to a via in the other column. The vias 410 on opposite sides of the metal line 405 are formed in different layers, e.g., the layers above and below the metal line 405. The metal lines 405(1 . . . n) and the vias 410(1 . . . n−1) therefore form a continuous "serpentine" structure that provides a single conductive path through the metal layers. For example, the structure 400 extends continuously from a node A that is electrically connected to the highest level metal line 405(n) to a node B that is electrically connected to the lowest level metal line 405(1), which is in turn electrically connected to a node B. Consequently, the interconnect structure 400 shown in FIG. 4A provides a continuous conductive path that electrically connects the nodes A-B. Interrupting this continuous or "serpentine" structure at any point in any layer can break the electrical connection between the nodes A-B.

FIG. 4B conceptually illustrates the second exemplary embodiment of the interconnect structure 400 after it has been modified. In the illustrated embodiment, the interconnect structure 400 has been modified by a re-spinning the second metal layer to change the configuration of the metal lines 405(2) to interrupt or sever the single metal line 405(2) to form to unconnected metal lines 415(1, 2) and thereby break or interrupt the conductive path between the vias 4100(1) and 410(2). Modification of the interconnect structure 300 to interrupt the single metal line 405(2) therefore breaks or interrupts the conductive path between the nodes A and B so that these nodes are no longer electrically connected. The modifications to the interconnect structure 400 therefore modify the electrical connection between the nodes A and B from an uninterrupted electrical connection to a broken or interrupted electrical connection. As will be discussed herein, modifying the electrical connection can also be used to modify operation of functional elements that include embodiments of the interconnect structure 400. Although FIG. 4B depicts one embodiment in which the metal line 405(2) is modified to form the disconnected metal lines 415(1, 2) in the second metal layer, in alternative embodiments the electrical connection between the nodes A and B can be broken by modifying any one (or more) of the metal lines 405 in any one (or more) of the metal layers.

Figure 5:
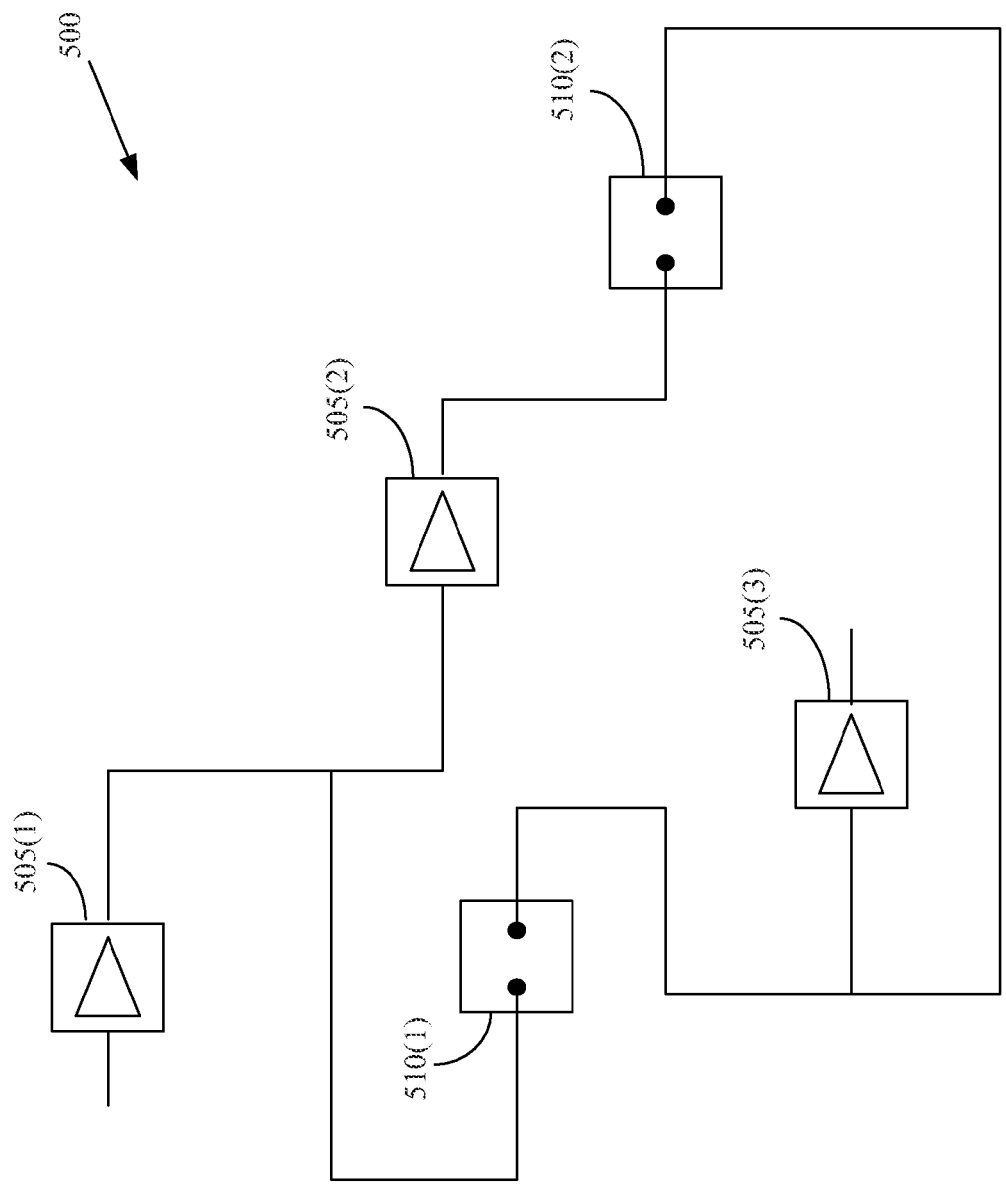
FIG. 5 conceptually illustrates one exemplary embodiment of an integrated circuit.

FIG. 5 conceptually illustrates one exemplary embodiment of an integrated circuit 500. In the illustrated embodiment, the integrated circuit 500 includes a group of standard cells 505 that may be electrically interconnected by conductive lines or paths. Each of the standard cells 505 implements a particular function or logic that may be the same or different than the function or logic of the other standard cells 505. The integrated circuit 500 also includes interconnect structures 510 such as the structures depicted in FIGS. 3A-B and 4A-B. In the illustrated embodiment, the interconnect structures 510 are initially configured to have open electrical connections and so the interconnect structures 510 may be implemented using structures such as the interconnect structure 300 shown in FIG. 3A. In this embodiment, the standard cell 505(3) is electrically isolated from the standard cells 505(1-2) and therefore is not a functional part of the integrated circuit 500. However, persons of ordinary skill in the art having benefit of the present disclosure should appreciate that in alternative embodiments the interconnect structures 510 may initially be configured to have closed electrical connections and may therefore be implemented using structures such as the interconnect structure 400 shown in FIG. 4A.

The state of the electrical connections in one or more of the interconnect structures 510 may be modified to change the structure and/or functionality of the integrated circuit 500. For example, the interconnect structures 510 may be modified to close the electrical connection across the interconnect structures 510 and thereby form a conductive path that incorporates the standard cell 505(3) into the circuit comprising the standard cells 505(1-2). In alternative embodiments, only one of the interconnect structures 510 may be modified so that a different conductive path is formed between the standard cells 505(1-2) and the standard cell 505(3). As discussed herein, the interconnect structures 510 can be modified by re-spinning one or more metal layers to change the electrical connection status of the interconnect structure 510.

Figure 6:
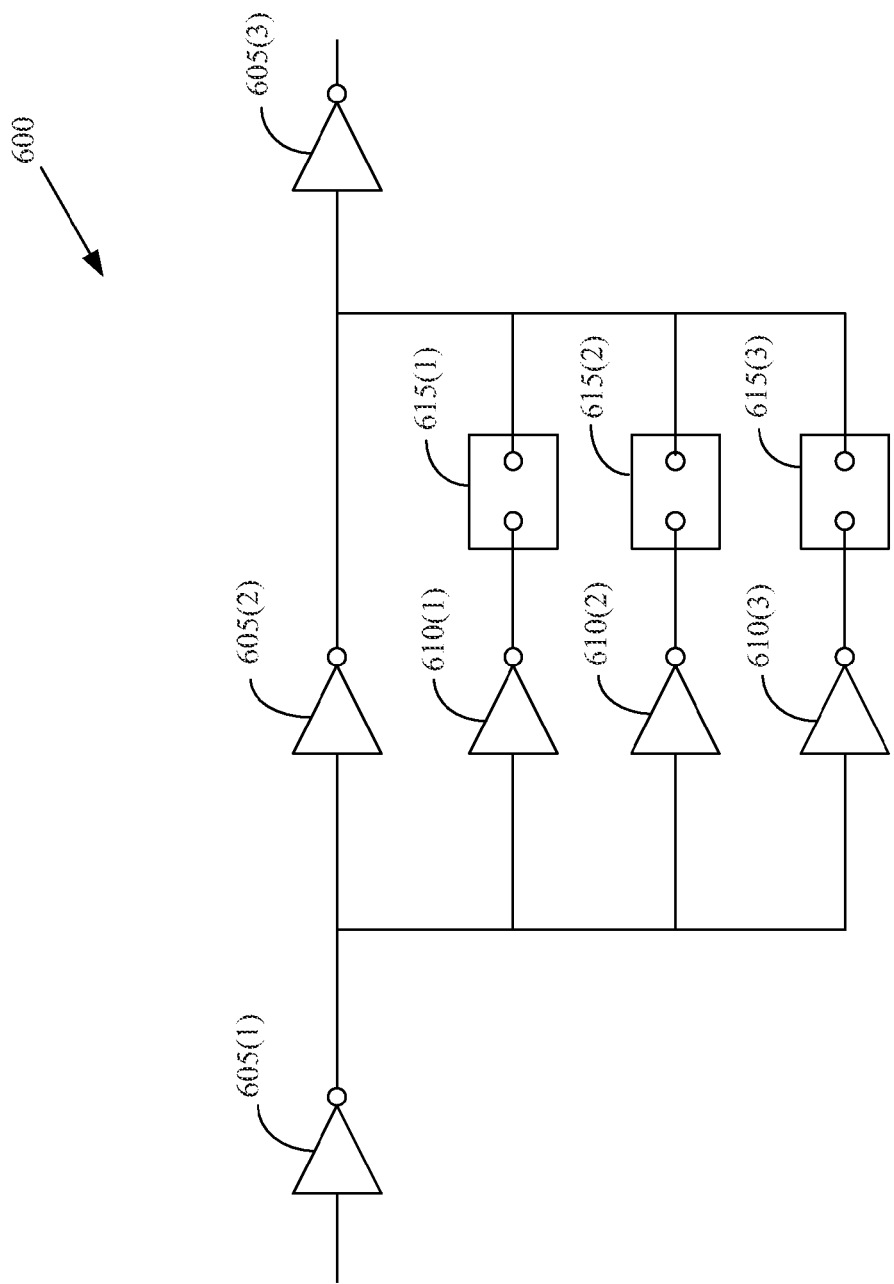
FIG. 6 conceptually illustrates one exemplary embodiment of a portion of a clock tree.

FIG. 6 conceptually illustrates one exemplary embodiment of a portion 600 of a clock tree. In the illustrated embodiment, the portion 600 includes inverters 605 that are coupled in series and additional inverters 610 that can be coupled in parallel with the inverter 605(2). The additional parallel fingers also include interconnect structures 615 that can be used to complete the electrical connection needed to couple the inverters 610 in parallel with the inverter 605(2). In the illustrated embodiment, the interconnect structures 615 initially have an open electrical connection so that the inverters 610 are not coupled in parallel with the inverter 605(2). The electrical connection can subsequently be modified, as discussed herein, to couple one or more of the inverters 610 in parallel with the inverter 605(2). Alternatively, the interconnect structures 615 may initially have a closed electrical connection so that the inverters 610 are initially coupled in parallel with the inverter 605(2). Adding or removing the parallel inverters 610 to the portion 600 can be used to increase or decrease the drive strength associated with the portion 600 to fine tune operation of the clock tree.

Figure 7A:
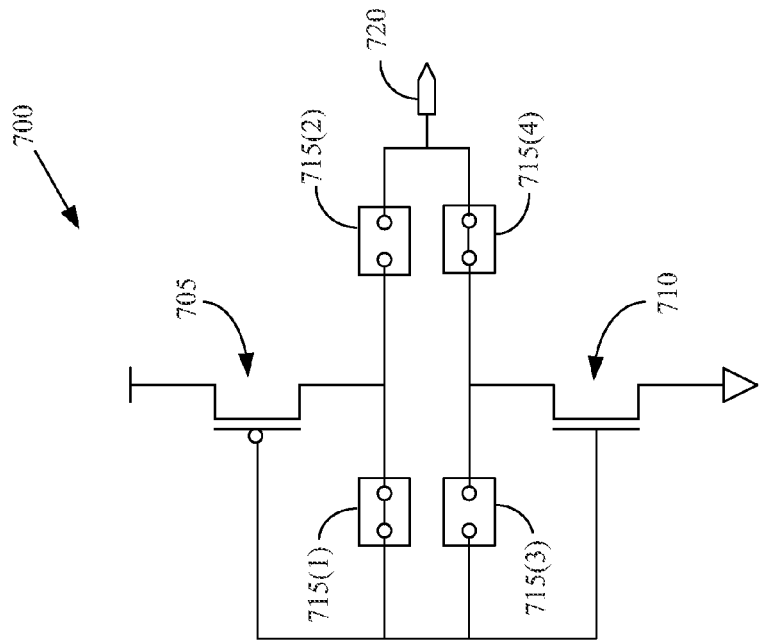
FIGS. 7A and 7B conceptually illustrate different states of a standard cell that may be part of a custom standard cell library used to realize different logic functions.
Figure 7B:
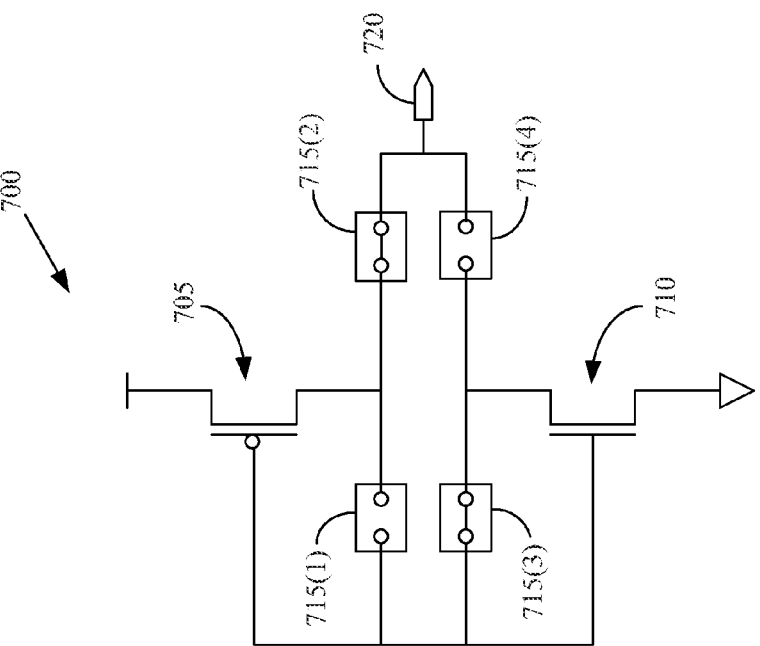

FIGS. 7A and 7B conceptually illustrate different states of a standard cell 700 that may be part of a custom standard cell library used to realize different logic functions. In the illustrated embodiment, the standard cell 700 includes a PMOS transistor 705 and an NMOS transistor 710 that are coupled between a supply voltage and ground. The standard cell 700 also includes interconnect structures 715 that are coupled between the transistors 705, 710 and a node 720. In different embodiments, the standard cell 700 can be configured as a tie-HI cell as shown in FIG. 7A or a tie-LO cell as shown in FIG. 7B. For example, when the interconnect structures 715 (1,4) have an open electrical connection and the interconnect structures 715(2,3) have a closed electrical connection, the standard cell 700 operates as a tie-HI cell. For another example, when the interconnect structures 715(2,3) have an open electrical connection and the interconnect structure 715 (1,4) have a closed electrical connection, the standard cell 700 operates as a tie-LO cell. In various embodiments, the standard cell 700 can be initialized in either state or in some other state, such as having all of the interconnect structures 715 initially set to an open or closed electrical connection. Operation of the standard cell 700 can then be modified using re-spins to change the nature of the electrical connections in the interconnect structures 715, as discussed herein.

Figure 8:
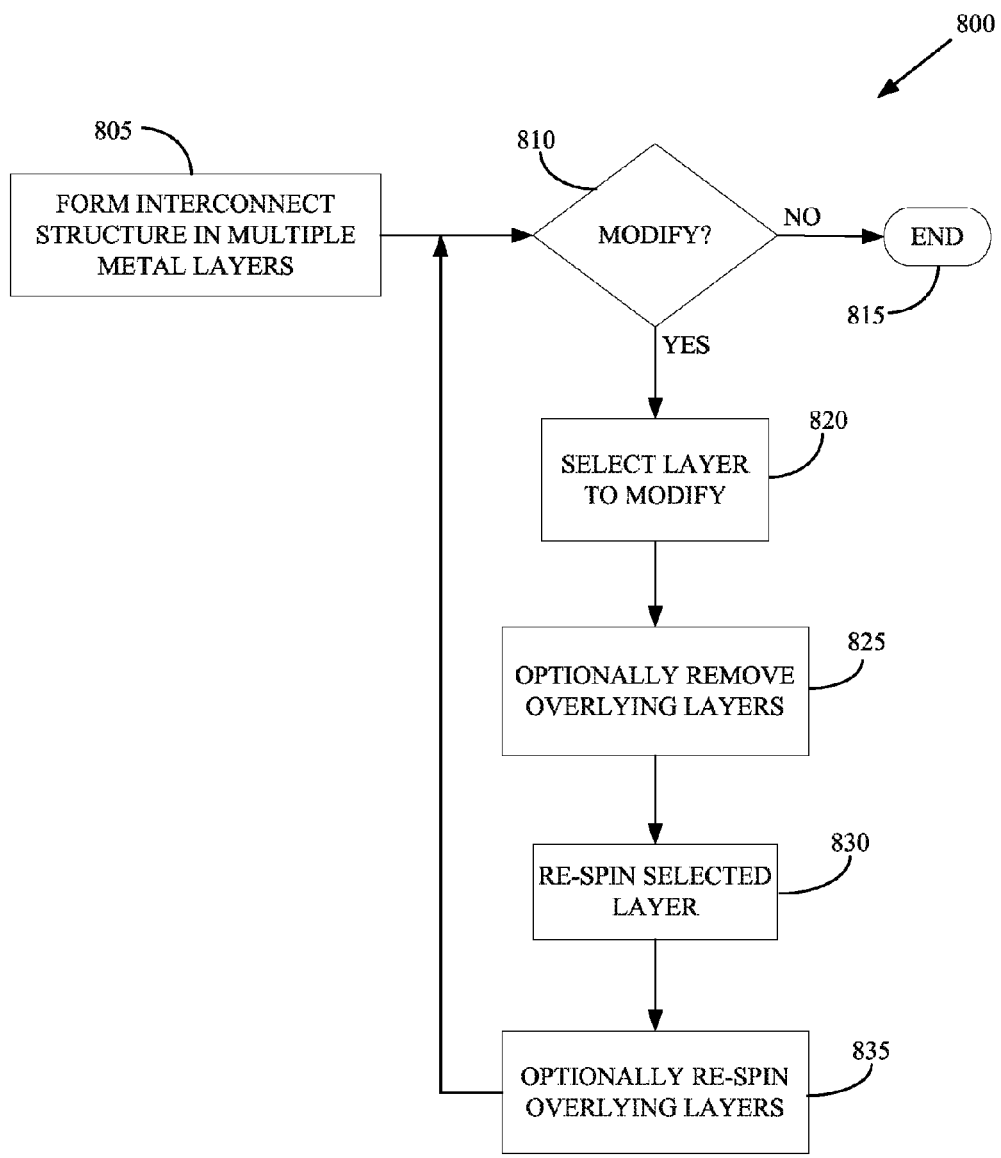
FIG. 8 conceptually illustrates one exemplary embodiment of a method of modifying interconnect structures in a semiconductor device.

FIG. 8 conceptually illustrates one exemplary embodiment of a method 800 of modifying interconnect structures in a semiconductor device. In the illustrated embodiment, one or more interconnect structures are formed (at 805) using metal lines and vias that traverse multiple metal layers within the semiconductor device. Exemplary embodiments of interconnect structures that may be formed (at 805) in the semiconductor device includes the electrically open and closed interconnect structures shown in FIGS. 3A-B and 4A-B. Measurements, tests, simulations, or other techniques may be used to determine (at 810) whether to modify one or more of the interconnect structures. If there is no need to modify (at 810) the interconnect structures, then the method may end (at 815). For example, if errors, defects, timing requirements, and the like are all within selected tolerances, the method may end (at 815).

A layer may be selected (at 820) for modification if it is determined (at 810) that one or more of the interconnect structures should be modified. Selection (at 820) of the layer may be based on a variety of criteria. For example, monetary and/or scheduling costs can be reduced by selecting the highest layer in the interconnect structure for re-spinning. Higher metal layers are typically less complex than the lower metal layers and modifying higher metal layers may therefore require fewer and/or less complex changes to the corresponding photolithography masks and removal/re-spinning of fewer overlying layers. For another example, layers may be selected (at 820) to reduce or minimize the number of masks that need to be changed, e.g., by selecting (at 820) layers that require other modifications to other portions of the semiconductor device so that changes can be consolidated into fewer layers. Any layers that overlay the layer that is scheduled for modification can be removed (at 825) along with the layer that is to be re-spun and then the selected layer can be re-spun (at 830). Any other layers that were removed (at 825) may also be re-spun (at 835) and additional measurements, tests, simulations, or other techniques may be used to determine (at 810) whether additional modifications are necessary.

Embodiments of processor systems (such as the processor system 100) or other semiconductor devices that include the modifiable interconnect structures described herein can be fabricated in semiconductor fabrication facilities according to various processor designs. In one embodiment, a processor design can be represented as code stored on a computer readable media. Exemplary codes that may be used to define and/or represent the processor design may include HDL, Verilog, and the like. The code may be written by engineers, synthesized by other processing devices, and used to generate an intermediate representation of the processor design, e.g., netlists, GDSII data and the like. The intermediate representation can be stored on computer readable media and used to configure and control a manufacturing/fabrication process that is performed in a semiconductor fabrication facility. The semiconductor fabrication facility may include processing tools for performing deposition, photolithography, etching, polishing/planarizing, metrology, and other processes that are used to form transistors and other circuitry on semiconductor substrates. The processing tools can be configured and are operated using the intermediate representation, e.g., through the use of mask works generated from GDSII data.

Portions of the disclosed subject matter and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

Note also that the software implemented aspects of the disclosed subject matter are typically encoded on some form of program storage medium or implemented over some type of transmission medium. The program storage medium may be magnetic (e.g., a floppy disk or a hard drive) or optical (e.g., a compact disk read only memory, or "CD ROM"), and may be read only or random access. Similarly, the transmission medium may be twisted wire pairs, coaxial cable, optical fiber, or some other suitable transmission medium known to the art. The disclosed subject matter is not limited by these aspects of any given implementation.

The particular embodiments disclosed above are illustrative only, as the disclosed subject matter may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed:

1. A semiconductor device, comprising:
a clock tree comprising at least a first functional element and a second functional element formed above a substrate, wherein nodes within the first functional element and the second functional element are electrically connected through a plurality of metal layers; and
at least one interconnect structure formed between at least two nodes in the plurality of metal layers, wherein the interconnect structure includes metal lines formed in each of the plurality of metal layers, and wherein the clock tree is fine-tuned by adding or removing parallel functional elements by modifying one of said metal lines in any one of the plurality of metal layers in said at least one interconnect structure, and wherein said metal lines are connected by a plurality of vias, and wherein modifying one of said metal lines in any one of the plurality of metal layers changes an electrical connection between said at least two nodes, and wherein changing the electrical connection modifies operation of the first functional element and the second functional element by connecting or disconnecting the first functional element and the second functional element.

2. The semiconductor device of claim 1, wherein at least one of said interconnect structures provides a conductive path between two nodes and the electrical connection between the two nodes can be broken by removing a portion of one of said metal lines in any one of the plurality of metal layers.

3. The semiconductor device of claim 2, wherein the first functional element and the second functional element are in different metal layers and wherein said metal lines and said vias in the interconnect structure form a single conductive path between the first functional element and the second functional element.

4. The semiconductor device of claim 3, wherein said metal lines in adjacent metal layers are connected by a single via, and wherein the vias connecting adjacent pairs of said metal lines are displaced from each other along a direction substantially perpendicular to a direction indicated by a separation of adjacent metal layers.

5. The semiconductor device of claim 4, wherein the electrical connection between the first functional element and the second functional element can be broken by removing a portion of one of said metal lines between a first via that connects said one of said metal lines to an upper adjacent metal line and a second via that connects said one of said metal lines to a lower adjacent metal line.

6. The semiconductor device of claim 1, wherein at least one of said interconnect structures does not provide a conductive path between two nodes and the electrical connection between the two nodes can be formed by forming a conductive path between two of said metal lines formed in one of the plurality of metal layers.

7. The semiconductor device of claim 1, wherein said at least one functional element comprises a standard logic cell, and wherein a logical operation performed by the standard logic cell is changed by modifying one of said metal lines in any one of the plurality of metal layers in said at least one interconnect structure.

8. The semiconductor device of claim 7, wherein the standard logic cell comprises a tie-HI cell that can be converted to a tie-LO cell by modifying four interconnect structures in the standard logic cell.

9. The semiconductor device of claim 1, wherein the interconnect structure comprises first and second metal lines formed in each of the metal layers, wherein the first and second metal lines are separated by a non-conductive region.

10. The semiconductor device of claim 9, wherein each first metal line is connected to first metal lines in adjacent metal layers by a first via, and wherein each second metal line is connected to second metal lines in adjacent metal layers by a second via.

11. The semiconductor device of claim 10, wherein the first functional element is electrically connected to one of the first metal lines and the second functional element is electrically connected to one of the second metal lines.

12. The semiconductor device of claim 11, wherein a conductive path is formed between the first functional element and the second functional element by forming an extended metal line from the first metal line through the non-conductive region to the second metal line in one of the metal layers.

13. A semiconductor device, comprising:
a standard logic cell comprising at least a first functional element and a second functional element formed above a substrate, wherein nodes within the first functional element and the second functional element are electrically connected through a plurality of metal layers; and
at least one interconnect structure formed between at least two nodes in the plurality of metal layers connected by a plurality of vias, wherein the interconnect structure includes at least one metal line formed in each of the plurality of metal layers, wherein said metal lines are connected by a plurality of vias, wherein the standard logic cell comprises a tie-HI cell that can be converted to a tie-LO cell by modifying four interconnect structures, wherein modifying one of said metal lines in any one of the plurality of metal layers changes an electrical connection between said at least two nodes, wherein said at least one interconnect structure connects or disconnects the first and second functional elements when one of said metal lines in any one of the plurality of metal layers is modified, and wherein changing the electrical connection changes a logical operation of said standard logic cell.

* * * * *